United States Patent
Abe et al.

(10) Patent No.: US 6,919,875 B2
(45) Date of Patent: Jul. 19, 2005

(54) FLIP-FLOP CIRCUIT, SHIFT REGISTER AND SCAN DRIVING CIRCUIT FOR DISPLAY DEVICE

(75) Inventors: Shinichi Abe, Kyoto (JP); Jun Maede, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 428 days.

(21) Appl. No.: 10/259,582

(22) Filed: Sep. 30, 2002

(65) Prior Publication Data

US 2003/0063079 A1 Apr. 3, 2003

(30) Foreign Application Priority Data

Oct. 2, 2001 (JP) ........................................ 2001-306450

(51) Int. Cl.[7] .............................. G09G 3/36; G06F 7/38; H03K 3/289
(52) U.S. Cl. ......................... 345/100; 345/204; 326/46; 327/202
(58) Field of Search ............................... 345/100, 204; 326/40, 46; 327/202

(56) References Cited

U.S. PATENT DOCUMENTS

| | | | | |
|---|---|---|---|---|
| 5,280,203 A | * | 1/1994 | Hung et al. ................... 326/37 |
| 5,323,065 A | * | 6/1994 | Ebihara et al. .............. 327/202 |
| 5,406,134 A | * | 4/1995 | Menut ......................... 327/203 |
| 5,459,421 A | * | 10/1995 | Shaw .......................... 327/203 |
| 5,552,738 A | * | 9/1996 | Ko ............................. 327/203 |
| 5,781,171 A | * | 7/1998 | Kihara et al. ................. 345/93 |
| 5,877,740 A | * | 3/1999 | Hirakata et al. ............. 345/103 |
| 6,225,969 B1 | * | 5/2001 | Ishii .......................... 345/100 |
| 6,232,939 B1 | * | 5/2001 | Saito et al. ................... 345/93 |
| 6,445,235 B1 | * | 9/2002 | Sachdev ...................... 327/202 |
| 6,683,603 B2 | * | 1/2004 | Murai et al. ................. 345/204 |

FOREIGN PATENT DOCUMENTS

JP 6-54860 7/1994

* cited by examiner

*Primary Examiner*—Xiao Wu
*Assistant Examiner*—M. Fatahiyar
(74) *Attorney, Agent, or Firm*—Mattingly, Stanger, Malur & Brundidge, P.C.

(57) ABSTRACT

In the present invention, an input terminal of a flip-flop circuit in master slave form which is formed by connecting two inverters in a loop shape is connected to a first terminal via a first switch circuit, an output terminal of the flip-flop circuit is connected to a second terminal via a second switch circuit, a third switch circuit is provided between the path from the first switch circuit to the input terminal and the second terminal, a fourth switch circuit is provided between the path from the output terminal to the second switch circuit and the first terminal, and through turning ON the first and second switch circuits and turning OFF the third and fourth switch circuits the first terminal is rendered operable as an input terminal and the second terminal is rendered operable as an output terminal, and through turning OFF the first and second switch circuits and turning ON the third and fourth switch circuits the second terminal is rendered operable as an input terminal and the first terminal is rendered operable as an output terminal.

19 Claims, 3 Drawing Sheets

FLIP-FLOP CIRCUIT, SHIFT REGISTER AND SCAN DRIVING CIRCUIT FOR DISPLAY DEVICE

BACKGROUND OF THE INVENTION

1. Field of the Invention

The present invention relates to a flip-flop circuit, a shift register and a scan driving circuit using the same for a display device and, more specifically, relates to a flip-flop circuit, which permits an inverse change-over of the input and output, in other words permits a so called bidirectional operation and limits the circuit scale increase thereof, a shift register which is constituted by the flip-flop circuit, of which shift operation control in positive and reverse directions is performed easily and which is suitable for a scan driving circuit in a small sized and thinned display device, and a scan driving circuit therefor.

2. Background Art

For a flip-flop circuit used in an IC circuit, a D type flip-flop circuit in a master slave form in which inverters are connected in a loop shape as shown in FIG. 4 is often used. Further, in the drawing, CK is a clock signal, *CK is an inverted clock signal with regard to the phase thereof, numeral 1 is a latch circuit at the master side and 2 is another latch circuit at the slave side.

Herein, the master side latch circuit (a master flip-flop) 1 is constituted by two inverters 3a and 3b and two transmission gates 4a and 4c operating as analog switches, and the slave side latch circuit (a slave flip-flop) 2 is constituted by two inverters 3d and 3e and two transmission gates 5a and 5b operating as analog switches.

When the flip-flop circuit constituted by these elements operates as master and slave, the transmission gates 4a and 5b and the transmission gates 4b and 5a are respectively turned "ON/OFF" in an inverted phase timing. In this flip-flop circuit a terminal 11 operates as the input side and a terminal 12 operates as the output side.

Now, symbol "*" in the drawing implies an inverted signal which is used throughout the specification in the same meaning.

The assignee of the present application applied an application relating to a bidirectionally operable flip-flop circuit which is an improvement of FIG. 4 flip-flop circuit and permits an inverting change-over of the input and output as Japanese Patent Application Number 62-246345 (now patented as JP-B-6-54860). FIG. 5 shows the above improved bidirectionally operable flip-flop circuit.

6 and 7 are respectively transmission gates similar to the transmission gates 4a and 4b as shown in FIG. 4, and 8 is a transmission gate added at the side of the output terminal 12 in the flip-flop circuit as shown in FIG. 4. In this D type flip-flop circuit at the back side of the transmission gate 8 an input and output terminal 14 is provided in place of the output terminal 12 in FIG. 4, and the input terminal 11 in FIG. 4 is designated as an input and output terminal 13. In this circuit, placing the transmission gate 5a at the center, a flip-flop 9a and a flip-flop 9b are disposed in symmetry and a symmetric structure is formed as a whole. Therefore, any one of the flip-flops 9a and 9b can be selected as a master flip-flop and the other as a slave flip-flop, thereby, a bidirectionally operable D type flip-flop circuit which permits an inverting changing-over of the output and input is constituted. A shift register which makes use of such flip-flop circuit can select its shift direction. Such selection can be performed by exchanging the master and slave of the flip-flop (latch circuit) 9a and the flip-flop (latch circuit) 9b constituting the shift register.

However, when constituting a shift register with the bidirectionally operable flip-flop circuit as shown in FIG. 5, although it is easy to selectively set the shift direction in any one of two directions afterward, however, if it is required to constitute a shift register which is operable bidirectionally in dynamic manner, it is necessary to introduce an operation control circuit which exchanges the master and slave flip-flop of the D-flip-flops in the respective stages of the shift register.

Such as in a LCD display device and a LED display device, in case when displaying a display image as a mirror display, a dynamic reverse scanning is required. Further, such as in an organic EL display device, in order to improve display brightness simultaneous scanning of a panel divided into top and bottom two parts in opposite directions from top and bottom in vertical direction is effected. Therefore, for the scan driving circuit in these types of display devices a bidirectionally operable shift register is necessitated.

On the other hand, in view of the small sizing and thinning requirement for these types of devices it is not preferable to increase the circuit scale thereof. However, if a shift register is constituted by making use of the bidirectionally operable flip-flop circuit as shown in FIG. 5 and the same is used as a driving circuit for bidirectional scanning in a display device, an input and output control circuit which controls timing of the transmission gate 4a and the transmission gate 8 disposed respectively at both sides of the input and output depending on the input and output directions and clock CK is necessitated for respective stages of the shift register which causes a problem of increasing the circuit scale thereof.

SUMMARY OF THE INVENTION

An object of the present invention is to resolve the problems in the conventional art and is to provide a flip-flop circuit which permits an inverting change-over of the input and output, of which bidirectional operation control is easily performed and which limits the circuit scale increase.

Further, another object of the present invention is to provide a shift register of which bidirectional operation control is easily performed.

Still another, object of the present invention is to provide a scan driving circuit for a display device of which bidirectional operation control is easily performed.

A feature of a flip-flop circuit according to a first aspect of the present invention which achieves the above object is, in a flip-flop circuit in a master slave form including an input terminal and an output terminal in which circuits each formed by connecting two inverters in a loop shape are connected in two stages, to provide with, a first switch circuit which connects the input terminal with a first terminal;

a second switch circuit which connects the output terminal with a second terminal;

a third switch circuit disposed between the path from the first switch circuit to the input terminal and the second terminal; and a fourth switch circuit disposed between the path from the output terminal to the second switch circuit and the first terminal;

wherein when the first and second switch circuits are turned ON and the third and fourth switch circuits are turned OFF, the first terminal operates as an input terminal and the second terminal operates as an output terminal, and oppositely when the first and second switch circuits are turned OFF and the third and fourth switch circuits are turned ON, the second terminal operates as an input terminal and the first terminal operates as an output terminal.

Further, a feature of the flip-flop circuit according to a second aspect of the present invention is to provide with a unit circuit which includes a first inverter, a first switch circuit connected to an input side of the first inverter, a second inverter receiving an output signal of the first inverter, and a second switch circuit inserted between an output side of the second inverter and the input side of the first inverter; a cascade connection circuit connecting the unit circuits in two stage cascade connection in which the side of the first switch circuit not connected to the first inverter is used as an input terminal and the output side of either the first or second inverter is used as an output terminal; a third switch circuit which connects the input terminal of the unit circuit in the first stage of the cascade connection circuit to a first terminal; a fourth switch circuit which connects the output terminal of the unit circuit in the second stage of the cascade connection circuit to a second terminal; a fifth switch circuit inserted between the path (wiring line) from the third switch circuit to the input terminal of the unit circuit in the first stage and the second terminal; and a sixth switch circuit inserted between the path from the output terminal of the unit circuit in the second stage to the fourth switch circuit and the first terminal; wherein when the third and fourth switch circuits are turned ON and the fifth and sixth switch circuits are turned OFF, the first terminal operates as an input terminal and the second terminal operates as an output terminal, and oppositely when the third and fourth switch circuits are turned OFF and the fifth and sixth switch circuits are turned ON, the second terminal operates as an input terminal and the first terminal operates as an output terminal.

Further, a feature of the shift register and the scan driving circuit for a display device according to the present invention is to constitute the shift register by connecting in cascade multiple of the flip-flop circuits according to the first or second aspect of the present invention or to use such shift register for the scan driving circuit for a display device.

In thus constituted flip-flop circuit in a master slave form in which inverters are connected in a loop shape and which is used for an IC circuit, the input terminal is connected to the first terminal via the first switch circuit and the output terminal is connected to the second terminal via the second switch circuit. When the first and second switch circuits (in the second aspect of the present invention the third and fourth switch circuits) are turned ON, the first terminal operates as an input terminal and the second terminal operates as an output terminal, thereby, an operation of a flip-flop circuit in a usual master slave form can be realized.

On the other hand, when the first and second switch circuits (in the second aspect of the present invention the third and fourth switch circuits) are turned OFF to isolate the input and output terminals of the flip-flop circuit form the first and second terminals and the third and fourth switch circuits (in the second aspect of the present invention the fifth and sixth switch circuits) are turned ON, the second terminal is connected to the input terminal of the master flip-flop via the third switch circuit (in the second aspect of the present invention the fifth switch circuits) and the first terminal is connected to the output terminal of the slave flip-flop via the fourth switch circuit (in the second aspect of the present invention the sixth switch circuits). Thereby, an exchange between the input terminal and output terminal can be achieved.

Namely, namely through ON/OFF control of the first switch circuit through the fourth switch circuit (in the second aspect of the present invention the third switch circuit through sixth switch circuit) the input terminal and the output terminal of the flip-flop circuit can be inverted so that the first and second terminal can be operated as bidirectional input/output terminals.

The control of the input and output directions in this instance can be effected only through ON/OFF of the first switch circuit through the fourth switch circuit (in the second aspect of the present invention the third and fourth switch circuits), and since the ON/OFF control is not related to the clock CK, the control can be sufficiently performed only with ON/OFF control signals. Moreover, the four switch circuits and the corresponding wiring amount for the connection and operation never increases the circuit scale as in the bidirectional timing control circuit which performs timing control of the input and output in response to input and output direction and clock CK.

As a result, the bidirectionally operable flip-flop circuit which permits an inverting change-over of the input and output can be easily realized through ON/OFF change-over of switches while suppressing the circuit scale increase. When constituting a shift register by making use of the bidirectionally operable flip-flop circuits, a shift register which permits change-over of the input and output direction thereof in a simple manner can be formed. Further, when such shift register is made use of for a driving circuit which performs a bidirectional scan control, a scan driving circuit for a display device which permits an easy bidirectional control can be realized.

DESCRIPTION OF THE PREFERRED EMBODIMENTS

Figure 1:
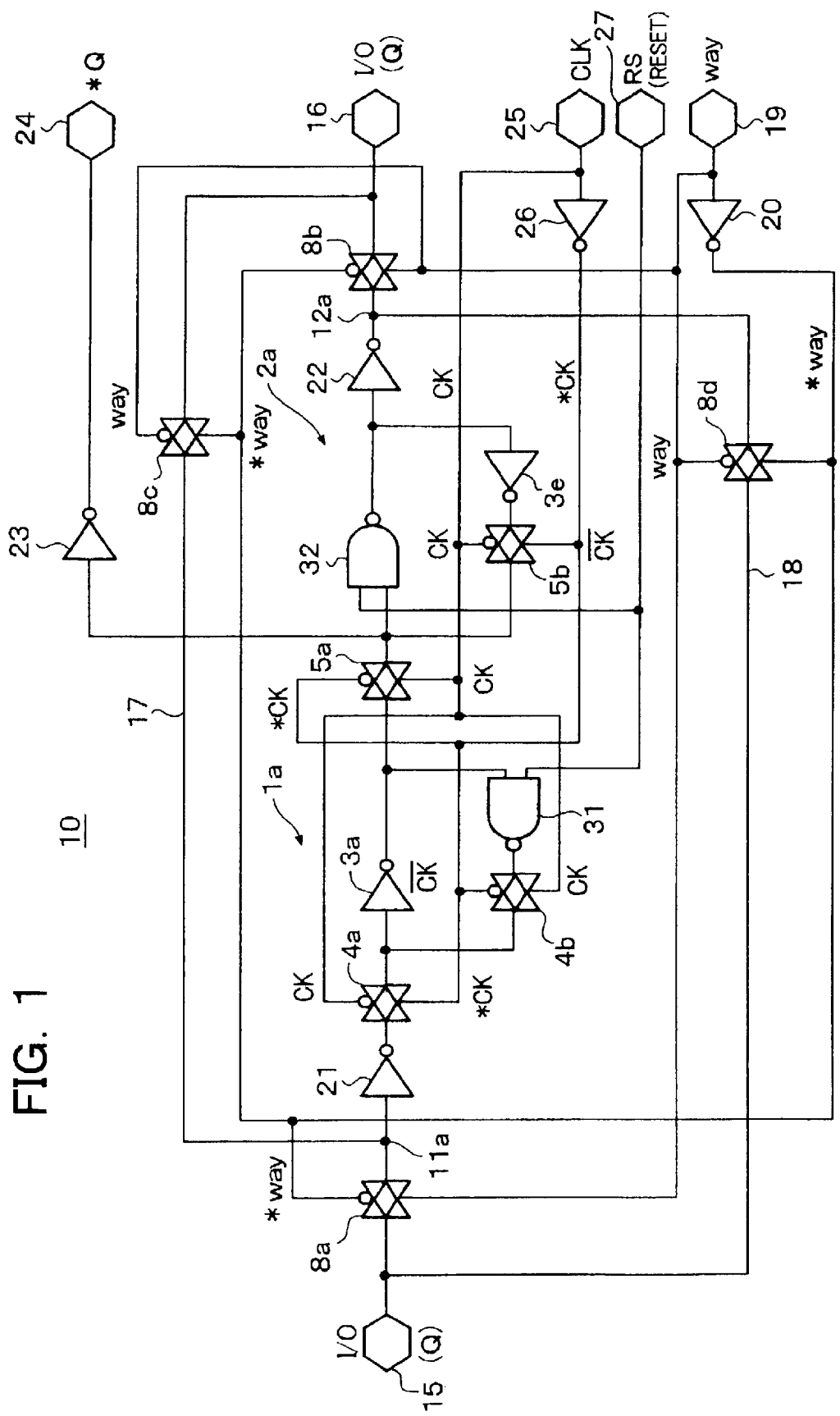
FIG. 1 is a block diagram of a flip-flop circuit for a shift register representing an embodiment to which the present invention is applied.
Figure 2:
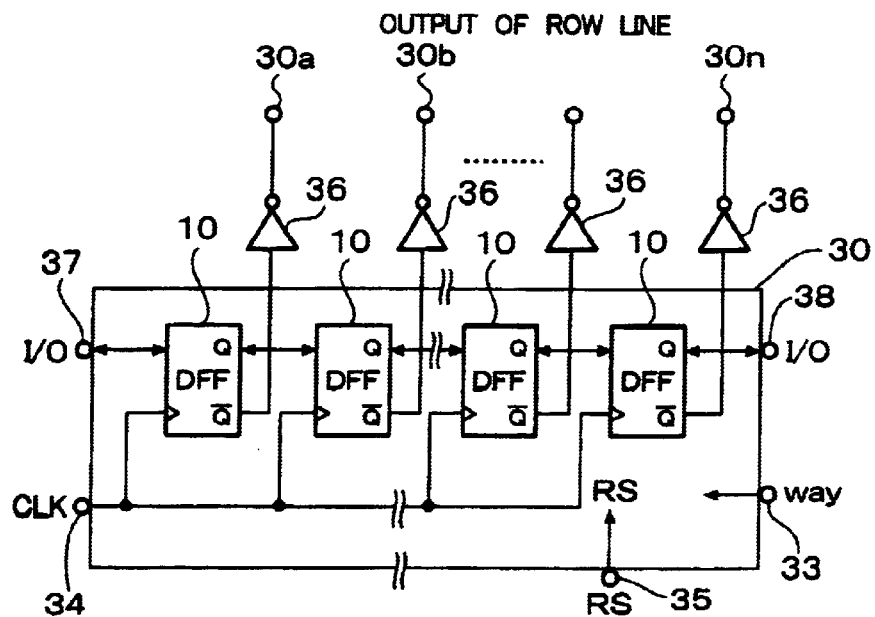
FIG. 2 is a view for explaining the shift register in a scan driving circuit for a display device which is constituted by the flip-flop circuit.
Figure 4:
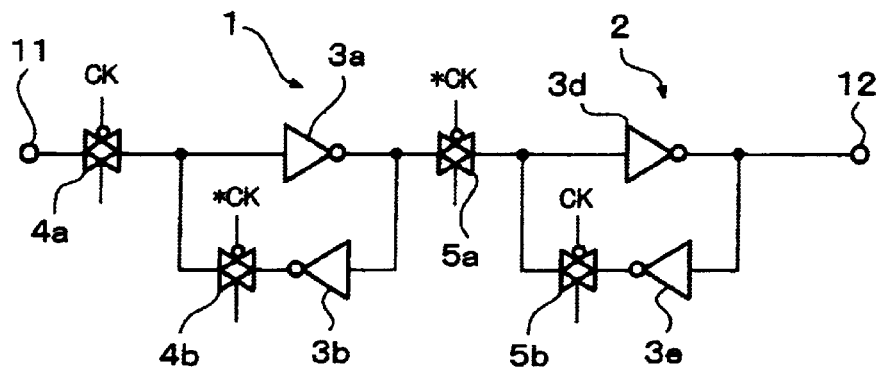
FIG. 4 is a block diagram of a conventional flip-flop circuit for constituting a shift register.
Figure 5:
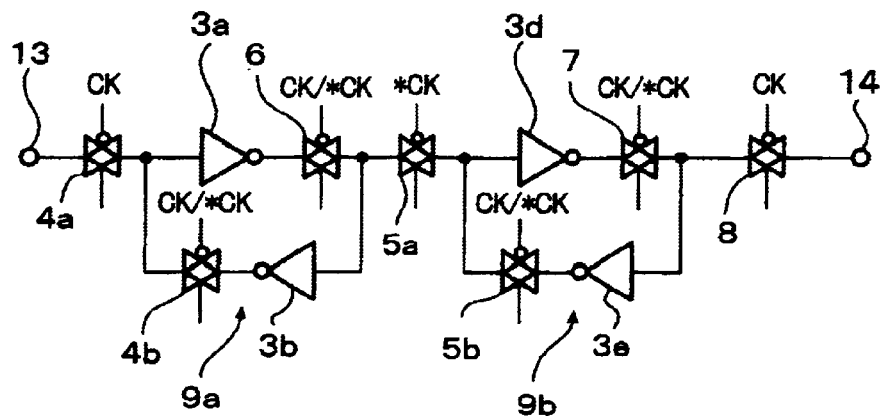
FIG. 5 is a block diagram of a conventional bidirectionally operable flip-flop circuit for constituting a shift register.
Figure 3:
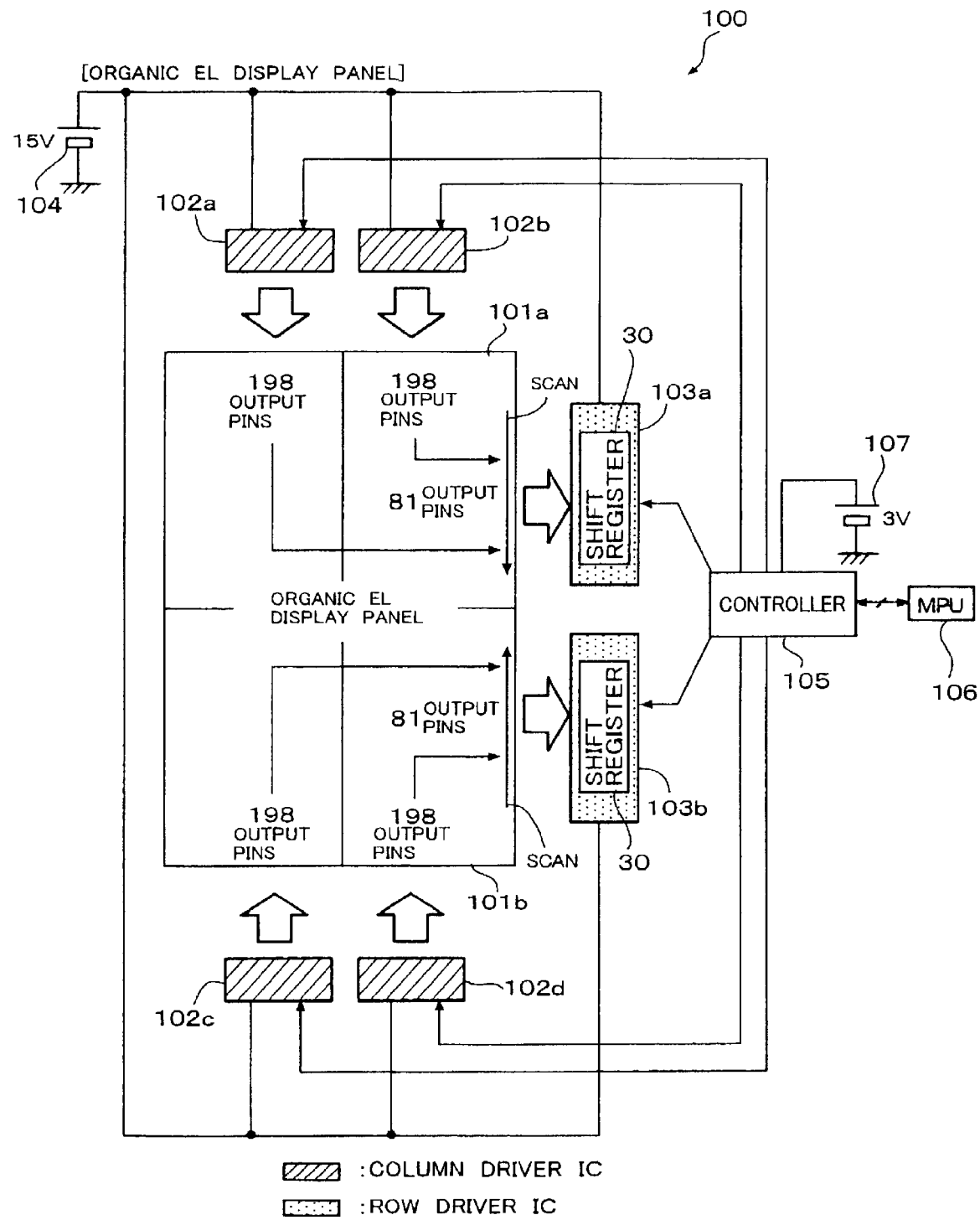
FIG. 3 is a block diagram of an embodiment locating an organic EL display panel for an organic EL display device at the center in which a row line driving circuit is constituted by the shift register as shown in FIG. 2.

In the explanation of FIGS. 1 through 3 hereinbelow, the same constitutions as in FIGS. 4 and 5 are designated by the same reference numerals and the explanation thereof is omitted.

A flip-flop circuit 10 in FIG. 1 is constituted by a master side latch circuit 1a corresponding to the master side latch circuit (a master flip-flop) 1 in FIG. 4 and a latch circuit 2a corresponding to the slave side latch circuit (a slave flip-flop) 2 in FIG. 4. Between an input point 11a corresponding to the input terminal 11 in the flip-flop circuit in FIG. 4 and an input and output terminal (I/O terminal) 15, a transmission gate 8a for changing over the input and output direction is provided. Further, between an output point 12a corresponding to the output terminal 12 and an I/O terminal 16, a transmission gate 8b for changing over the input and output direction is provided.

Namely, in place of the input terminal 11 and the output terminal 12 in FIG. 4 the I/O terminals 15 and 16 are provided. The input point 11a and the I/O terminal 16 are connected by a wiring line 17 via a direction change-over transmission gate 8c, and the output point 12a and the I/O terminal 15 are connected by a wiring line 18 via an input and output direction change-over transmission gate 8d.

In the flip-flop circuit 10, the inverters 3b and 3d are respectively replaced by NAND gates 31 and 32. This is for resetting the flip-flop circuit 10, when a terminal 27 receives a reset signal RS. Further, in the flip-flop circuit between the input point 11a and the transmission gate 4a an inverter 21 is inserted and prior to the output point 12a an inverter 22 is inserted for adjusting timing, however, such inverters are not necessarily required to be provided.

The respective transmission gates 8a through 8d for the direction change-over receive a direction change-over signal Way outputted from a controller at a terminal 19 and are ON/OFF controlled by "H" (HIGH level) and "L" (LOW level) of the signal. Further, with the direction change-over signal way an inverted signal *Way is produced via an inverter 20 and is applied to inverted input sides of the respective transmission gates 8a through 8d. Still further, the clock CK is an internal signal corresponding to an external clock signal CLK applied to a clock terminal 25, and with the clock CK an inverted clock *CK is provided via an inverter 26 and these clocks CK and *CK are applied to such as respective transmission gates 4a, 4b, 5a and 5b.

Q bar output (*Q) of the flip-flop circuit 10 is applied from the back side of the transmission gate 5a in the slave side latch circuit 2a to a terminal 24 via an inverter 23 and is output therefrom. Q output of the flip-flop circuit 10 is determined by the direction change-over signal Way and one of the I/O terminals 15 and 16 operates as an input terminal and the other operates as an output terminal depending on the data shift direction.

In the present embodiment, when the direction change-over signal Way inputted at the terminal 19 is "H", the transmission gates 8a and 8b are turned ON and the transmission gates 8c and 8d are turned OFF. In this instance, the input point 11a is connected to the I/O terminal 15 and assumes an input terminal and the input point 12a is connected to the I/O terminal 16 and assumes an output terminal, which implies that the I/O terminal 15 operates as an input terminal and the I/O terminal 16 operates as an output terminal so as to constitute a flip-flop circuit including a master side latch circuit 1a and a slave side latch circuit 2a. In this instance, since the transmission gates 8c and 8d are turned OFF, the input point 11a is not connected to the side of the I/O terminal 16, and the output point 12a is not connected to the side of the I/O terminal 15.

On the other hand, when the direction change-over signal Way inputted at the terminal 19 is "L", the transmission gates 8a and 8b are turned OFF and the transmission gates 8c and 8d are turned ON. Therefore, the input point 11a is connected to the I/O terminal 16 and assumes an input terminal and the output point 12a is connected to the I/O terminal 15 and assumes an output terminal which constitutes the flip-flop circuit including the master side latch circuit 1a and the slave side latch circuit 2a in the same manner as above, however, since the I/O terminal 16 operates as an input terminal and the I/O terminal 15 operates as an output terminal, a flip-flop circuit with an inverted input and output is constituted. In this moment, since the transmission gates 8a and 8b are turned OFF, the input point 11a is not connected to the side of the I/O terminal 15 and the output point 12a is not connected to the side of I/O terminal 16.

In the manner as explained above, depending on "H" and "L" of the direction change-over signal Way inputted at the terminal 19, a shift register 30 (see FIG. 2) constituted by such flip-flop circuit 10 can change-over the input and output direction.

FIG. 2 shows the shift register 30 which is constituted by cascade connecting Q outputs and inputs of the flip-flop circuits (DFF) 10, and the I/O terminals 15 and 16 of the flip-flop circuits 10 in both ends are respectively connected to both end input and output terminals (I/O terminal) 37 and 38 of the shift register 30.

The terminals 19 for the direction change-over signal Way of the respective flip-flop circuits 10 are connected to a Way terminal 33, the clock terminals 25 of the respective flip-flop circuits 10 are connected to a clock terminal 34 and the terminals 27 for the reset signal of the respective flip-flop circuits 10 are connected to a reset terminal 35.

Further, the Q bar outputs (*Q) 30a through 30n of the respective flip-flop circuits 10 are respectively taken out via inverters 36 as respective row line outputs in the scan driving circuit for the display device.

In this moment, data which is set at one of the I/O terminals 37 and 38 assumes "1" for the digit corresponding to the line position to be driven and "1" for the other digits and data having digits corresponding to the line number, for example, "1110111 ... 11" is inputted from a controller 105 as shown in FIG. 3 to the shift register 30 (respectively to a row driver 103a and a row driver 103b as shown in FIG. 3).

In this circuit, since the data is shifted in response to the external clock CLK inputted at the clock terminal 34, "H" pulse is generated as Q bar output (*Q) at the position of digit "0" among the data row. The pulse is outputted as "L" via the inverter 36 and drives a line for the scanning position among the row lines in the display panel. Then the data is shifted toward upper digits (right side) or lower digits (left side) in the shift register 30 in response to the clock CK to thereby perform scanning of the row lines.

At this moment, when signal "H" is inputted from the controller 105 to the terminal 19 for the direction change-over signal Way, the transmission gates 8a and 8b are turned ON and the transmission gates 8c and 8d are turned OFF, and the scan driving is performed from the I/O terminal 37 toward the I/O terminal 38. Oppositely, when signal "L" is inputted from the controller 105 to the terminal 19 for the direction change-over signal Way, the transmission gates 8a and 8b are turned OFF and the transmission gates 8c and 8d are turned ON and the scan driving is performed from the I/O terminal 38 toward the I/O terminal 37.

FIG. 3 shows an embodiment in which such shift register 30 is used for the scan driving circuit in an organic EL display device.

FIG. 3 is an embodiment in which the organic EL display panel for the organic EL display device located at the center thereof includes the scan driving circuit for driving the row lines by making use of the shift register 30 as shown in FIG. 2.

In FIG. 3, 100 is an organic EL display panel for an organic EL display device used for a portable phone which includes 396 pieces (198 pieces×2) of terminal pins (hereinbelow will be referred to simply as pins) for column lines and 162 pieces (81 pieces×2) of pins for row lines. The panel 100 employs a configuration in which two pieces of upper and lower EL panels 101a and 101b are joined at the center thereof. At the upper side thereof two pieces of column drivers IC (hereinbelow will be simply referred to as column driver) 102a and 102b are provided, likely at the lower side thereof two pieces of column drivers 102c and 102d are provided. Further, as the row driver IC (hereinbelow will be simply referred to as row driver) row drivers 103a and 103b corresponding to respective EL display panels 101a and 101b are provided.

With regard to the respective drivers for color display use, R, G and B are respectively allotted internally to 66 pins in one piece of column terminal drive IC, in that column outputs corresponding to 66×3=198 pins in total are formed. In the drawing such is illustrated in a simplified manner without discriminating R, G and B.

The respective column drivers 102a, 102b, 102c and 102d and the respective row drivers 103a and 103b are fed from a power source (battery) 104 for driving the organic EL display panel and are driven thereby. As the voltage of the power source one voltage usually in a range of about 12V~15V, for example, 15V is used.

The row driver 103a and the row driver 103b use the same driver ICs in which the I/O terminals 37 of the shift registers 30 are selected as the data input terminals and I/O terminals 38 thereof are selected the data output terminals.

In the present embodiment, the direction change-over signal Way outputted from the controller 105 is sent out to the Way terminal 33 of the row driver 103a, and further sent out to the Way terminal 33 of the row driver 103b via an inverter. Thereby, the row driver 103a and the row driver 103b scan the organic EL display panel in opposite directions.

These drivers operate in response to control signals from the controller 105 and the column side drivers perform the scanning by using the respective output lines for horizontal direction line scanning and the row side drivers perform the scanning by using the respective output lines for vertical direction scanning.

Further, the controller 105 is controlled by a microprocessor unit (MPU) 106, is fed power from a power source (battery) 107 having voltage of 3V and is driven thereby. Therefore, the power source 104 for driving the organic EL display panel can be obtained from the battery power source 107 by boosting up the same with a DC-DC converter.

In the present embodiment, the row driver 103a performs the vertical direction scanning of the EL panel 101a from the above to the downward as illustrated and the row driver 103b performs the vertical direction scanning of the EL panel 101b from the bottom to the upward. These scanning directions are in the opposite directions. The reason of such scanning is that through simultaneous vertical scanning of the two panels the brightness thereof is doubled and through the respective scanning in opposite directions the joint portion of the two panels becomes unremarkable.

In this instance, it is required that the scanning directions of the row driver 103a and the row driver 103b are inverted, however, through the use of the shift register as shown in FIG. 2, even if the same driver ICs are used for the row driver 103a and the row driver 103b the scanning in opposite directions can be performed only by sending out the direction change-over signal from the controller 105 and both of the respective scan driving directions can be easily inverted.

Hereinbelow, the vertical scanning operation will be explained. At first data having number of digits corresponding to the number of lines "0111111 . . . 11" is set from the controller 105 to the shift register 30 in the row driver 103a. Further, data having number of digits corresponding to number of lines "111111 . . . 10" is set from the controller 105 to the shift register 30 in the row driver 103b. Signal "H" is provided from the controller 105 to the Way terminal 33 of the row driver 103a and signal "L" is provided from the controller 105 via an inverter to the Way terminal 33 of the row driver 103b.

Thereby, the scanning directions of the row driver 103a and the row driver 103b are inverted. The row driver 103a generates scan driving signals in vertical direction of the EL display panel 101a from the above to downward in response to clock CLK, when the first digit position is "0". The row driver 103b generates scan driving signals in vertical direction of the EL display panel 101b from the bottom to upward in response to clock CLK, when the first (the last in the positive direction) digit position in the opposite direction scanning is "0".

Thereby, the row driver 103a and the row driver 103b can perform scanning in opposite directions at the same time in response to clocks CLK sent out from the controller 105 to the clock terminal 34.

With such bidirectional shift register 30 the same driver ICs can be used for the column drivers in the display device, and the direction change-over can be easily effected by the direction change-over signals Way. As a result, the control circuit therefor is simplified.

In the above FIG. 3 embodiment, the vertical scanning directions of the row driver 103a and the row driver 103b were explained to be controlled in opposite directions at the same time, however, when it is required to display images in a mirror display, an inverting scanning in horizontal direction is necessitated for the same driver. The shift register as shown in FIG. 2 can, of course, be used for such horizontal direction scanning. Such scanning also can be easily performed through the scanning direction change-over control by switching the control signals Way between "H" and "L".

In the flip-flop circuit as shown in FIG. 1 embodiment, in order to provide the reset terminal a NAND gate is used in place of one of the inverters in the flip-flop, however, the operation thereof is equivalent to an inverter, therefore, it is believed to be permitted to treat the same as an inverter. Therefore, in the present specification and claims below the gate circuit having the above inverter operation is included in an inverter.

Further, in the present embodiment the output of the master side latch circuit (master flip-flop) 1a is taken out from the inverter 3a and the same is inputted to the slave side latch circuit (slave flip-flop) 2a. However, it is, of course, possible that the output of the master side latch circuit 1a is taken out from the NAND gate 31 and the same is inputted to the slave side latch circuit 2a. In such instance, the output of the slave side latch circuit 2a is taken out from the inverter 3c. In this modified constitution the *Q output to be taken out at the terminal 24 can be directly taken out from the transmission gate 5a not via the inverter 23.

Further, the *Q output in the embodiments can be taken out from any positions along the wiring path in which an inverted output with respect to Q output from the slave side latch circuit 2a can be obtained.

Still further, in the present embodiments the transmission gate is used for the switch circuit, however, other types of analog switches or switch circuits such as a MOSFET transistor and a bipolar transistor can be, of course, used therefor.

In the present embodiments, the organic EL display panel is exemplified, however, since the scanning direction change-over is performed such as in a mirror display, the present invention is, of course, applicable to a variety of display devices.

What is claimed is:

1. A flip-flop circuit in a master slave form including an input terminal and an output terminal in which circuits each formed by connecting two inverters in a loop shape are connected in two stages comprising:

a first switch circuit which connects the input terminal with a first terminal;

a second switch circuit which connects the output terminal with a second terminal;

a third switch circuit disposed between the path from the first switch circuit to the input terminal and the second terminal; and a fourth switch circuit disposed between the path from the output terminal to the second switch circuit and the first terminal;

wherein when the first and second switch circuits are turned ON and the third and fourth switch circuits are turned OFF, the first terminal operates as an input terminal and the second terminal operates as an output terminal, and oppositely when the first and second switch circuits are turned OFF and the third and fourth switch circuits are turned ON, the second terminal operates as an input terminal and the first terminal operates as an output terminal.

2. A flip-flop circuit according to claim 1, further comprising a predetermined terminal which receives one of a signal having HIGH level and a signal having LOW level, wherein when the predetermined terminal receives predetermined one of the signal having HIGH level and the signal having LOW level, the first and second switch circuits are turned ON and the third and fourth switch circuits are turned OFF, and when the predetermined terminal receives the other of the signal having HIGH level and the signal having LOW level, the first and second switch circuits are turned OFF and the third and fourth switch circuits are turned ON.

3. A flip-flop circuit according to claim 2, wherein at least one of the two inverters is a gate circuit which performs an inverter operation and the first through fourth switch circuits selectively receive one of the signal having HIGH level and the signal having LOW level via the predetermined terminal.

4. A shift register comprising a plurality of the flip-flop circuits according to claim 1, wherein the plural flip-flop circuits are cascade connected in such a manner that each of the second terminals of the plural flip-flop circuits is connected to the first terminal of the flip-flop circuit in the following stage, and through turning ON the first and second switch circuits in the respective flip-flop circuits and turning OFF the third and fourth switch circuits therein, the first terminal is rendered operable as an input terminal and the second terminal is rendered operable as an output terminal, and oppositely through turning OFF the first and second switch circuits and turning ON the third and fourth switch circuits the second terminal is rendered operable as an input terminal and the first terminal is rendered operable as an output terminal.

5. A shift register according to claim 4, further comprising a predetermined terminal which receives one of a signal having HIGH level and a signal having LOW level, wherein when the predetermined terminal receives predetermined one of the signal having HIGH level and the signal having LOW level, the first and second switch circuits are turned ON and the third and fourth switch circuits are turned OFF, and when the predetermined terminal receives the other of the signal having HIGH level and the signal having LOW level, the first and second switch circuits are turned OFF and the third and fourth switch circuits are turned ON.

6. A shift register according to claim 5, wherein at least one of the two inverters is a gate circuit which performs an inverter operation and the first through fourth switch circuits selectively receive one of the signal having HIGH level and the signal having LOW level via the predetermined terminal.

7. A scan driving circuit for a display device comprising the shift register according to claim 4, wherein the outputs of the flip-flop circuits in the shift register are used as driving signals for vertical scanning lines or horizontal scanning lines of a display panel.

8. A scan driving circuit for a display device according to claim 7, wherein an inverted signal with respect to a signal outputted at the second terminals of the flip-flop circuits is outputted from the plural flip-flop circuits and the outputs are used as the driving signals for the scanning lines.

9. A flip-flop circuit comprising: a unit circuit which includes a first inverter, a first switch circuit connected to an input side of the first inverter, a second inverter receiving an output signal of the first inverter, and a second switch circuit inserted between an output side of the second inverter and the input side of the first inverter; a cascade connection circuit connecting the unit circuits in two stage cascade connection in which the side of the first switch circuit not connected to the first inverter is used as an input terminal and the output side of either the first or second inverter is used as an output terminal; a third switch circuit which connects the input terminal of the unit circuit in the first stage of the cascade connection circuit to a first terminal; a fourth switch circuit which connects the output terminal of the unit circuit in the second stage of the cascade connection circuit to a second terminal; a fifth switch circuit inserted between the path from the third switch circuit to the input terminal of the unit circuit in the first stage and the second terminal; and a sixth switch circuit inserted between the path from the output terminal of the unit circuit in the second stage to the fourth switch circuit and the first terminal; wherein when the third and fourth switch circuits are turned ON and the fifth and sixth switch circuits are turned OFF, the first terminal operates as an input terminal and the second terminal operates as an output terminal, and oppositely when the third and fourth switch circuits are turned OFF and the fifth and sixth switch circuits are turned ON, the second terminal operates as an input terminal and the first terminal operates as an output terminal.

10. A flip-flop circuit according to claim 9, wherein an output side of the first inverter connected to an input side of said second inverter, the unit circuit is a latch circuit and the cascade connection circuit is a circuit in which the cascade connection is effected by using the output side of the first inverter as the output terminal.

11. A flip-flop circuit according to claim 10, further comprising a predetermined terminal which receives one of a signal having HIGH level and a signal having LOW level, wherein when the predetermined terminal receives predetermined one of the signal having HIGH level and the signal having LOW level, the third and fourth switch circuits are turned ON and the fifth and sixth switch circuits are turned OFF, and when the predetermined terminal receives the other of the signal having HIGH level and the signal having LOW level, the third and fourth switch circuits are turned OFF and the fifth and sixth switch circuits are turned ON.

12. A flip-flop circuit according to claim 11, wherein at least one of the first and second inverters is a gate circuit which performs an inverter operation and the third through sixth switch circuits selectively receive one of the signal having HIGH level and the signal having LOW level via the predetermined terminal.

13. A shift register comprising a plurality of the flip-flop circuits according to claim 9, wherein the plural flip-flop circuits are cascade connected in such a manner that each of the second terminals of the plural flip-flop circuits is connected to the first terminal of the flip-flop circuit in the following stage, and through turning ON the third and fourth switch circuits in the respective flip-flop circuits and turning OFF the fifth and sixth switch circuits therein, the first terminal is rendered operable as an input terminal and the second terminal is rendered operable as an output terminal, and oppositely through turning OFF the third and fourth switch circuits and turning ON the fifth and sixth switch circuits the second terminal is rendered operable as an input terminal and the first terminal is rendered operable as an output terminal.

14. A shift register according to claim 13, wherein the unit circuit is a latch circuit and the cascade connection circuit is a circuit in which the cascade connection is effected by using the output side of the first inverter as the output terminal.

15. A shift register according to claim 14, further comprising a predetermined terminal which receives one of a signal having HIGH level and a signal having LOW level, wherein when the predetermined terminal receives predetermined one of the signal having HIGH level and the signal having LOW level, the first and second switch circuits are turned ON and the third and fourth switch circuits are turned OFF, and when the predetermined terminal receives the other of the signal having HIGH level and the signal having LOW level, the first and second switch circuits are turned OFF and the third and fourth switch circuits are turned ON.

16. A flip-flop circuit according to claim 15, wherein at least one of the two inverters is a gate circuit which performs an inverter operation and the first through fourth switch circuits selectively receive one of the signal having HIGH level and the signal having LOW level via the predetermined terminal.

17. A scan driving circuit for a display device comprising the shift register according to claim 13, wherein the outputs of the flip-flop circuits in the shift register are used as driving signals for vertical scanning lines or horizontal scanning lines of a display panel.

18. A scan driving circuit for a display device according to claim 17, wherein an inverted signal with respect to a signal outputted at the second terminals of the flip-flop circuits is outputted from the plural flip-flop circuits and the outputs are used as the driving signals for the scanning lines.

19. A scan driving circuit for a display device according to claim 18, wherein the unit circuit is a latch circuit and the cascade connection circuit is a circuit in which the cascade connection is effected by using the output side of the first inverter as the output terminal.

* * * * *